(12) United States Patent
Pehrsson et al.

(10) Patent No.: US 6,915,221 B2
(45) Date of Patent: Jul. 5, 2005

(54) SELF LEARNING SYSTEM AND METHOD FOR PREDICTING REMAINING USAGE TIME FOR DIFFERENT MODES OF A MOBILE DEVICE

(75) Inventors: Göran Pehrsson, Malmö (SE); Kristoffer Ptasinski, Lund (SE); Anders Långberg, Trelleborg (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 49 days.

(21) Appl. No.: 10/298,966

(22) Filed: Nov. 18, 2002

(65) Prior Publication Data

US 2004/0098222 A1 May 20, 2004

(51) Int. Cl.$^7$ .............................................. G06F 19/00
(52) U.S. Cl. ........................................ 702/63; 320/134
(58) Field of Search ........................... 702/63, 64, 185, 702/176, 182; 320/133, 134

(56) References Cited

U.S. PATENT DOCUMENTS

| | | | | |
|---|---|---|---|---|
| 5,248,929 A | | 9/1993 | Burke ........................... | 320/48 |
| 5,333,176 A | | 7/1994 | Burke et al. ................... | 379/58 |
| 5,587,924 A | * | 12/1996 | Rossi ............................ | 702/63 |
| 5,635,813 A | | 6/1997 | Shiga et al. .................... | 320/2 |
| 5,654,623 A | | 8/1997 | Shiga et al. .................... | 320/48 |
| 5,684,861 A | * | 11/1997 | Lewis et al. .................. | 455/405 |
| 5,838,140 A | * | 11/1998 | Rosenthal ..................... | 320/133 |
| 6,038,515 A | | 3/2000 | Kikuchi et al. ................ | 702/63 |
| 6,046,574 A | | 4/2000 | Baranowski et al. | |
| 6,088,431 A | * | 7/2000 | LaDue ...................... | 379/114.2 |
| 6,389,474 B1 | * | 5/2002 | Chien et al. ................. | 709/232 |
| 6,404,753 B1 | * | 6/2002 | Chien et al. ................. | 370/337 |
| 6,408,020 B1 | | 6/2002 | Kaji et al. .................... | 375/216 |
| 6,564,073 B1 | | 5/2003 | Uggmark et al. | |

FOREIGN PATENT DOCUMENTS

| | | |
|---|---|---|
| EP | 0 593 198 A2 | 4/1994 |
| EP | 0 794 438 A2 | 9/1997 |
| EP | 0 854 583 | 7/1998 |
| JP | 11023678 | 1/1999 |
| JP | 11069442 | 3/1999 |
| JP | 2001147259 | 5/2001 |
| SE | 514 258 | 1/1999 |
| WO | WO 00/45189 A2 | 8/2000 |
| WO | WO 00/45189 A3 | 8/2000 |
| WO | WO 00/45568 A1 | 8/2000 |

OTHER PUBLICATIONS

Standard Search Report completed Jul. 21, 2003.

* cited by examiner

*Primary Examiner*—Edward Raymond
(74) *Attorney, Agent, or Firm*—Jenkens & Gilchrist, P.C.

(57) ABSTRACT

A method for determining usage time for a plurality of modes of a mobile device wherein a self learning table within the mobile device includes a plurality of storage locations for storing current usage values and each of the storage locations has an association with a zparticular mode of the terminal. Additional storage locations may be added to the table responsive to new modes of operation of the mobile device,

22 Claims, 2 Drawing Sheets

| Mode | Current Usage |
|---|---|
| Mode #1 | 7 |
| Mode #2 | 8 |
| Mode #3 | 6 |
| Mode #4 | 3 |
| | |
| | |
| | |
| | |

SELF LEARNING SYSTEM AND METHOD FOR PREDICTING REMAINING USAGE TIME FOR DIFFERENT MODES OF A MOBILE DEVICE

TECHNICAL FIELD

The present invention relates to determining remaining usage time for mobile telephones, and more particularly, to a self learning method for predicting remaining usage time for different modes of a mobile telephone.

BACKGROUND OF THE INVENTION

Users of portable battery powered communication devices are dependent on a fully functional device. More specifically, the users need to know exactly for how long their devices will remain functional, until the electrical energy stored in the battery has been consumed and the battery has to be recharged. This is particularly true for users of mobile telephones.

In order to determine a precise estimation of the remaining operational time of a mobile telephone, the user needs an accurate and well functioning battery capacity indicator or "fuel gauge". Determining the remaining battery capacity includes two separate current measurements One measurement from the current flowing into the battery "charging" and one measurement for the current consumed from the battery "discharging". The charging current is often relatively easy to measure. A microprocessor "CPU" may determine the current signal which is directly proportional to the current flowing through a small resistor. Since a microprocessor controls the charging process, it will also have access to all relative data for calculating the total energy, that has been supplied to the battery during a certain period of time.

Determining the discharge current or current consumption is much more difficult, particularly for advanced telephones with complex functionalities and many operating modes. Traditionally, discharged current is measured by calculating the expected current consumption, when the telephone is in different operating modes. Earlier mobile telephones basically had two operating modes, talk mode and standby mode. With such telephones, the current consumption for talk modes and standby modes was measured once in a test laboratory environment and stored in memory in the telephone as respective, predetermined consumption values. In operation, the telephone would keep track of the time spent in talk mode and standby modes and subsequently calculate the total amount of energy consumed within the battery by multiplying the respective operational times by the predetermined consumption values.

Recently it has been possible to use application specific integrated circuits (ASICS) to measure current flowing in and out of a battery. To be able to predict remaining operating time, existing mobile telephones are required to track how each setting of the mobile telephone sets current consumption from a battery. The added current consumption for each setting must be measured in a lab and stored within the mobile telephone's non-volatile memory at production. The software in the mobile telephone is configured to consider the different menu settings when calculating remaining operating time for the battery. Additionally, the mobile telephone must track activities towards the network within various modes such as standby and call. This could be done by counting the number of RX, TX and SYNT strobes in the different modes of telephone. Each strobe contains a certain amount of energy that is measured in the lab and stored as a parameter in the non-volatile memory. These networks activities must be included when estimating the current power consumed in each mode of the mobile telephone.

These methods, however, are quite complex to use in practice due to the large amount of measurements that must be done in the lab, and the large amount of data that must be stored in the mobile phone. Each increases the complexity and cost associated with a mobile telephone

SUMMARY OF THE INVENTION

The present invention comprises an apparatus and method for determining usage time for a plurality of modes of a mobile device. A processor, in conjunction with circuitry for determining current usage values for various modes of the mobile device determines a current usage value for a first mode of the mobile telephone. The current usage value is stored in a table for storing the current usage values at a location associated with the mode of the mobile device. A determination may then be made of remaining usage time for the mode responsive to the current usage value stored in the table.

BRIEF DESCRIPTION OF THE DRAWINGS

A more complete understanding of the method and apparatus of the present invention may be obtained by reference to the following Detailed Description when taken in conjunction with the accompanying Drawings wherein.

DETAILED DESCRIPTION

Figures 1, 2:
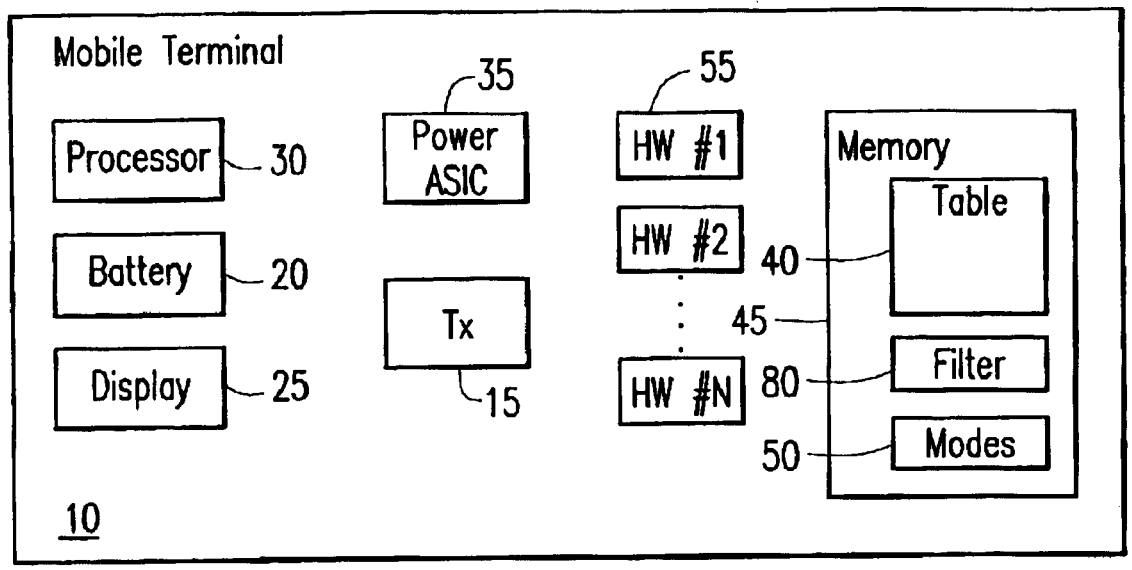
FIG. 1 is a block diagram of a mobile telephone implementing the system and method of the present invention.
FIG. 2 illustrates the self-learning table for storing current use values for various modes of the mobile telephone.

Referring now to the drawings, and more particularly to FIG. 1, there is illustrated a mobile terminal 10 according to the system and method of the present invention. While the present invention is described with respect to a mobile terminal 10, any mobile device would also be applicable to the present invention. The mobile terminal 10 includes a transceiver 15 enabling the mobile terminal 10 to wirelessly communicate with an associated wireless network (not shown). The wireless network may comprise a number of wireless communication technologies such as GSM, CDMA, UMTS, GPRS, etc. The mobile terminal 10 further includes a battery 20 for providing power enabling operation of the mobile terminal 10 and any associated hardware and software components associated therewith. A display 25 enables various visual indicators to be displayed to a user of the mobile terminal 10. Of particular interest to the present invention is a visual indication of the remaining usage time available for the battery 20 in various modes of operation of the mobile terminal.

According to the present invention, a remaining usage time for a battery 20 may be calculated using a processor 30, a power applications specific integrated circuit (ASIC) 35 and a self learning table 40 stored within a memory 45 of the mobile terminal 10. The power ASIC 35 is able to determine a current usage into or out of the battery 20 and is further able to determine a current usage associated with various modes of operation of the mobile telephone 10. The various modes of operation of the mobile telephone 10 may include various software configurations according to which the mobile telephone 10 is operated under control of mode software 50 executed by the processor 30; the operation of various hardware components 55 contained within and operated by the mobile terminal 10 under the control of processor 30, such as LCD, camera, MP3 audio player; or various combinations of the hardware and software. Options for various modes of use of interest to the user may be presented to the user via a menu. The user can select various modes from the menu and receive information on a usage time for the selected modes without actually putting the mobile terminal 10 into the selected mode.

The table 40 within memory 45, as more fully illustrated in FIG. 2, is configured to include an entry 60 for each mode of the mobile terminal 10 and an entry 70 for the current usage value associated with a particular mode. Thus, for each mode of the mobile terminal 10, a corresponding current usage can be determined using the power ASIC 35 and stored in the current usage entry 70 for the mobile terminal when a mode is first used. The table 40 is updated each time a particular mode is accessed by determining a current usage for the accessed mode and determining whether to replace an existing entry with the new measurement. A new current usage entry is compared to a previously stored current usage entry and placed in the table if the entries are different. Suitable filtering mechanisms 80 may be applied to changed entries of the table 40 in order to provide slow variations in the value of the entries for current usage.

Furthermore, when a new mode of the terminal 10 is first accessed by the mobile terminal and no entry 60 for the mode is currently available, a new entry 60 may be created within the table 40 such that a current usage value may be generated by the power ASIC 35 and stored as a new entry 70 in the table 40. In this way, the table is able to self learn and determine remaining time usage in any number of modes representing various hardware/software combinations. The first time a particular mode is assessed by the mobile telephone 10, remaining usage time may not be determined since a current usage value entry is not available for the mode. Thus, the mobile terminal 10 displays, for example, "LEARNING" during this time period. The next time the mode 50 is accessed by the mobile terminal, or after a value is stored, the current usage value is retrieved by the processor 30 from the table 40 and used to determine a remaining usage time for presentation upon the display 25.

Figure 3:
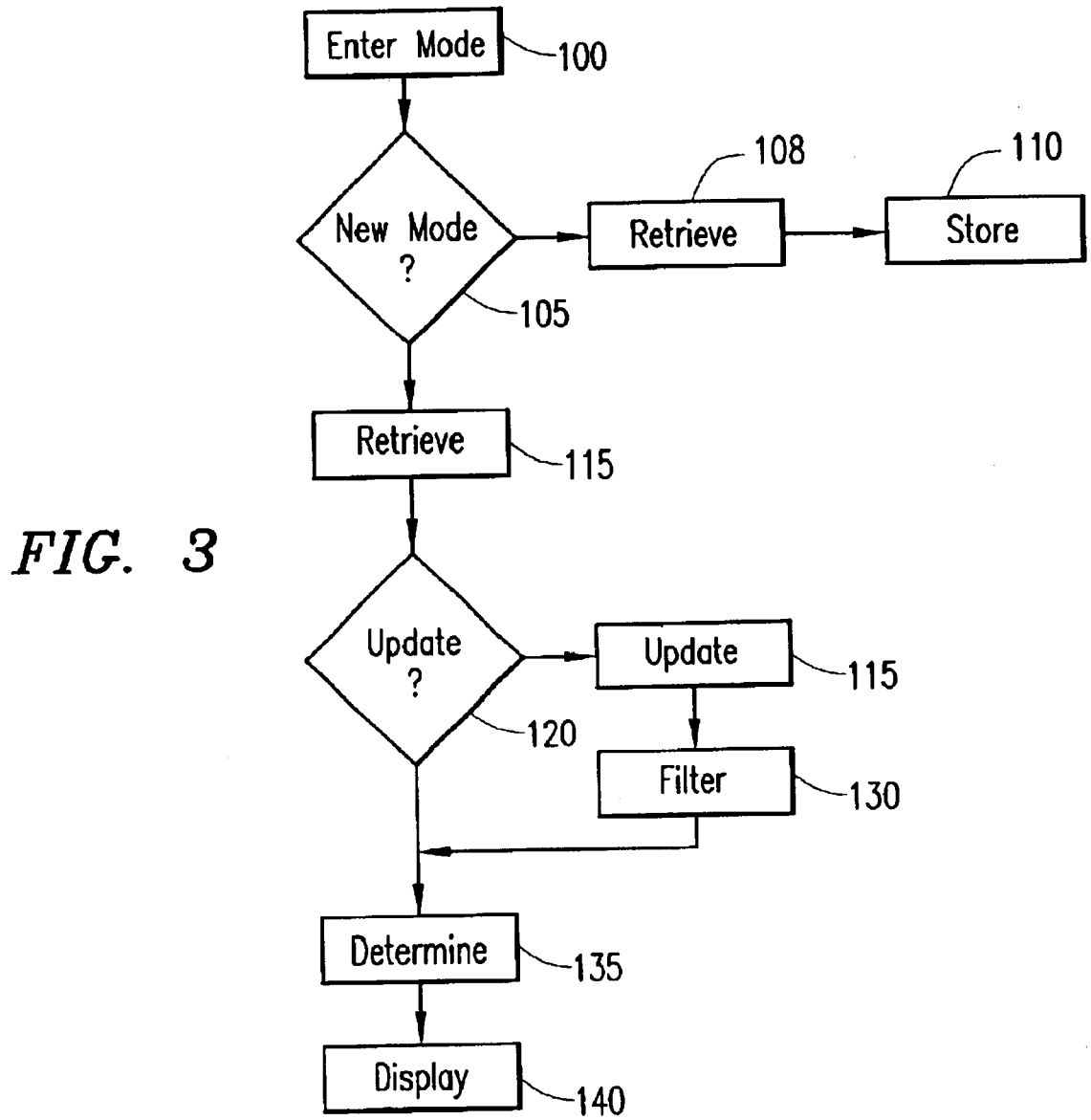
FIG. 3 is a flow diagram illustrating one embodiment for operation of a self learning table of the present invention.

Referring now to FIG. 3, there is illustrated one embodiment in which the system of the present invention may be implemented. After entry of a mode by the mobile terminal 10 at step 100, inquiry step 105 determines whether the terminal 10 has entered a mode not having an entry within the table 40. If so, a current usage value for the new mode is retrieved at 108 using power ASIC 35 and this new value is stored within a new entry in the table 40 at step 110 while displaying "LEARNING" on the on the display 25 of the mobile station.

If the mobile terminal has previously entered the mode and an entry exists within the table 40 for the mode, a present current usage value is determined for the mode at step 115 using power ASIC 35. Inquiry step 120 determines whether an update of the existing current usage entry is necessary and if so, the current usage value for the mode is updated at step 125. The updated value may be filtered if necessary at step 130 to prevent drastic changes within the presently stored current usage value for a mode. Filtering may in one embodiment be performed by averaging the current measurements over time but other filtering options may be used After updating at step 125 or if inquiry step 120 determines that no update is necessary, the obtained current usage value in the table 40 is used to determine a remaining usage time for the mode at step 135 which is displayed to a user at step 140. If desired, the table 40 can be preloaded with default values for use before a first use of a mode.

The previous description is of a preferred embodiment for implementing the invention, and the scope of the invention should not necessarily be limited by this description. The scope of the present invention is instead defined by the following claims.

What is claimed is:

1. A method for determining usage time for a plurality of modes of a mobile device, comprising the steps of:
   determining a battery current usage value for at least one mode of the mobile device responsive to accessing of the at least one mode by the mobile device;
   storing the battery current usage value for the at least one mode in a table at a location associated with the at least one mode, the step of storing the battery current usage value comprising:
   determining if the at least one mode has a previously stored battery current usage value;
   generating a new location associated with the at least one mode in the table if the at least one mode does not have the previously stored battery current usage value; and
   storing the battery current usage value in the generated new location; and
   determining the remaining usage time for the at least one mode of the mobile device responsive to the stored battery current usage value at the location associated with the at least one mode.

2. The method of claim 1, wherein the step of storing further comprises the step of replacing the previously stored battery current usage value with the battery current usage value if the at least one mode has the previously stored battery current usage value.

3. The method of claim 1, wherein the step of storing further comprises the step of filtering the battery current usage value prior to replacing the previously stored battery current usage value to limit an amount of change in the battery current usage value.

4. The method of claim 3, wherein the step of filtering comprises the step of averaging the battery current usage value.

5. The method of claim 1, further including the step of displaying an indicator that the mobile device is learning if the at least one mode does not have the previously stored battery current usage value.

6. The method of claim 1, further including the step of preloading a battery current usage value in the table prior to a at least one use of the at least one mode.

7. The method of claim 1, wherein the mobile device comprises a mobile telephone.

8. The method of claim 1, further including the steps of:
   displaying a plurality of modes for the mobile device in a menu; and
   receiving a selection of the at least one mode of the plurality of modes from the menu.

9. A method for determining usage time for a plurality of modes of a mobile device, comprising the steps of:
   determining a current usage value for a at least one mode for the mobile device responsive to accessing of the at least one mode by the mobile device;
   determining if the at least one mode has a previously stored current usage value;

generating a new location associated with the at least one mode in the table if the at least one mode does not have the previously stored current usage value;

storing the current usage value in the generated new location;

replacing the previously stored current usage value with the current usage value if the at least one mode has the previously stored current usage value;

filtering the current usage value prior to replacing the previously stored current usage value to limit an amount of change in the current usage value; and determining the remaining usage time for the at least one mode of the mobile device responsive to the stored current usage value at the location associated with the at least one mode.

10. The method of claim 9, further including the step of displaying an indicator that the mobile device is learning if the at least one mode does not have the previously stored current usage value.

11. The method of claim 9, further including the step of preloading a prestored battery current usage value in the table prior to a first use of the at least one mode.

12. The method of claim 9, wherein the step of filtering comprises the step of averaging the current usage value with the previously stored current usage value.

13. A mobile device, comprising:

first circuitry for determining a battery current usage value for each of a plurality of modes of the mobile device;

a table having a plurality of storage locations therein for storing battery current usage values, each of the storage locations associated with one of the plurality of modes;

a processor configured to store a first battery current usage value in a first storage location associated with at least one mode of the mobile device responsive to accessing of the at least one mode by the mobile device; and a filter for limiting changes in battery current usage values stored in the table.

14. The mobile device of claim 13, wherein the processor is further configured to determine the remaining usage time for the at least one mode of the mobile device responsive to the stored at least one battery current usage value at the first storage location associated with the at least one mode.

15. The mobile device of claim 14, wherein the filter averages battery current usage values.

16. The mobile device of claim 13, wherein the first circuitry comprises an application specific integrated circuit.

17. The mobile device of claim 13, wherein the processor is further configured to:

determine if the at least one mode has a previously stored battery current usage value;

generate a new location associated with the at least one mode in the table if the at least one mode does not have the previously stored battery current usage value; and store the battery current usage value in the generated new location.

18. The mobile device of claim 17, wherein the processor is further configured to replace the previously stored battery current usage value with the battery current usage value if the at least one mode has the previously stored battery current usage value.

19. The mobile device of claim 18, wherein the wherein the processor is further configured to filter the battery current usage value prior to replacing the previously stored battery current usage value to limit an amount of change in the battery current usage value.

20. The mobile device of claim 13, wherein battery current usage values are preloaded into the table prior to first uses of the plurality of modes.

21. The mobile device of claim 13, wherein the mobile device comprises a mobile terminal.

22. The mobile device of claim 13, wherein the processor is further configured to display a plurality of modes for the mobile device in a menu and receive a selection of the at least one mode of the plurality of modes from the menu.

* * * * *

UNITED STATES PATENT AND TRADEMARK OFFICE
CERTIFICATE OF CORRECTION

PATENT NO. : 6,915,221 B2
DATED : July 5, 2005
INVENTOR(S) : Goran Pehrsson et al.

It is certified that error appears in the above-identified patent and that said Letters Patent is hereby corrected as shown below:

Title page,
Item [57], ABSTRACT,
Line 8, replace "mobile device," with -- mobile device. --.

Column 1,
Line 25, replace "measurements" with -- measurements. --.

Column 2,
Line 9, replace "mobile telephone" with -- mobile telephone. --.

Column 4,
Line 52, replace "to a at least" with -- to at least --.

Signed and Sealed this

Twenty-seventh Day of September, 2005

JON W. DUDAS
*Director of the United States Patent and Trademark Office*